United States Patent [19]
Begg

[11] Patent Number: 5,868,832
[45] Date of Patent: Feb. 9, 1999

[54] MAGNETIC FIELD GENERATION

[75] Inventor: Michael Colin Begg, Worthing, United Kingdom

[73] Assignee: Tesla Engineering Limited, Sussex, England

[21] Appl. No.: 828,508

[22] Filed: Mar. 31, 1997

[30] Foreign Application Priority Data

Aug. 21, 1996 [GB] United Kingdom ................... 9617540

[51] Int. Cl.$^6$ ................................. C30B 15/20
[52] U.S. Cl. .......................... 117/32; 117/208; 117/917
[58] Field of Search ................... 117/917, 32, 208

[56] References Cited

U.S. PATENT DOCUMENTS

| 4,565,671 | 1/1986 | Matsutani et al. | 117/917 |
|---|---|---|---|
| 4,592,895 | 6/1986 | Matsutani et al. | 117/917 |
| 4,830,703 | 5/1989 | Matsutani | 117/32 |
| 5,349,921 | 9/1994 | Barraclough et al. | 117/917 |

FOREIGN PATENT DOCUMENTS

| 511663 | 4/1992 | European Pat. Off. | 117/32 |
|---|---|---|---|
| 62-3091 | 1/1987 | Japan | 117/917 |

OTHER PUBLICATIONS

Patent Abstract of Japanese Patent Appl. 63–248793, vol. 013, No. 056 (C–566), Feb. 8, 1989.
Patent Abstract of Japanese Patent Appl. 61–251594, vol. 011, No. 101 (C–413), Mar. 31, 1987.
Patent Abstract of Japanese Patent Appl. 58–199795, vol. 008, No. 041 (C–211), Feb. 22, 1984.
Patent Abstract of Japanese Patent Appl. 01–239081, vol. 013, No. 575 (C–667), Dec. 19, 1989.

Primary Examiner—Robert Kunemund
Attorney, Agent, or Firm—Nixon & Vanderhye P.C.

[57] ABSTRACT

Magnetic field generating apparatus comprises a pair of axially spaced coils which are so arranged that when energized, they produce a magnetic field which has a zero axial field or substantially zero axial field at an axial position midway between the coils. The annular space between the coils is filled with a material such as steel or steel with a layer of material magnetized in the radial direction, which enhances the radial field strength generated by the coils. The apparatus as application in the growth of single crystals of semiconductor material.

20 Claims, 4 Drawing Sheets

MAGNETIC FIELD GENERATION

BACKGROUND OF THE INVENTION

1. Field of the Invention

This invention relates to the generation of magnetic fields.

2. Related Art

The present invention has arisen as a result of a requirement in the field of crystal growth, but the application of the invention is not limited to such a field. Large single crystals of semiconductor material are grown by means of an apparatus which usually includes a crucible mounted coaxially within a heating element. The crucible contains a molten mass of the semiconductor material. The crucible can be raised or lowered relative to the heating elements and electrical energy for the heating elements is applied under computer control or otherwise in order to achieve a desired temperature profile. In order to grow a single crystal structure a seed of the semiconductor material is brought into contact with the surface of the molten material and then the seed is raised relative to the molten material in order to create the single crystal. During this process it is important that a precisely controlled temperature gradient is achieved within the volume of the heating element in order to achieve a successful crystal growth. Other factors also have to be critically controlled, e.g. seed pull rate, but these will be apparent to the man skilled in the art and are not critical for an understanding of the present invention.

It has also been recognised that applying magnetic fields to the molten material can have a beneficial effect on the crystal growth. When magnetic fields are applied to the molten material, it has also been recognised that there should be zero or near zero magnetic field at the interface of the crystal being grown and the melt material. A known way of achieving such a requirement is to use a magnetic field generating apparatus which comprises two horizontally arranged coils mounted coaxially one above the other and wound such that they are energised in opposite directions so as to produce substantially zero magnetic field at a point on the axis midway between the coils. Then in use the zero point is arranged to coincide with the interface of the crystal and the melt. This is usually achieved by raising or lowering the crucible containing the melt. The coils are also usually contained in a steel enclosure which acts both as a mechanical fixing for the coils and as a magnetic screen.

In order to reduce the power consumption it is known to be advantageous to separate the coils axially to provide an air gap therebetween.

SUMMARY OF THE INVENTION

In the present invention we propose locating in the region between the axially spaced coils a material which has the effect of enhancing when compared with the air gap, the magnetic field strength generated by the coil arrangement, and enhancing the magnetic field generated by a given power input.

Thus, according to the present invention there is provided apparatus for generating a magnetic field comprising first and second axially spaced coils which are so arranged that when energised, they produce a magnetic field which has a zero or substantially zero point at an axial position midway between the coils, wherein the annular space between the coils contains a material which enhances the field strength generated by the coils whilst maintaining said zero point.

The material may be steel. Alternatively the material may be steel with a layer of material magnetised in the radial direction. This other material may comprise Neodymium-iron-boron.

BRIEF DESCRIPTION OF THE DRAWINGS

The invention will be described now by way of example only, with particular reference to the accompanying drawings. In the drawings.

DETAILED DESCRIPTIONS OF EXEMPLARY EMBODIMENTS

Figure 1:
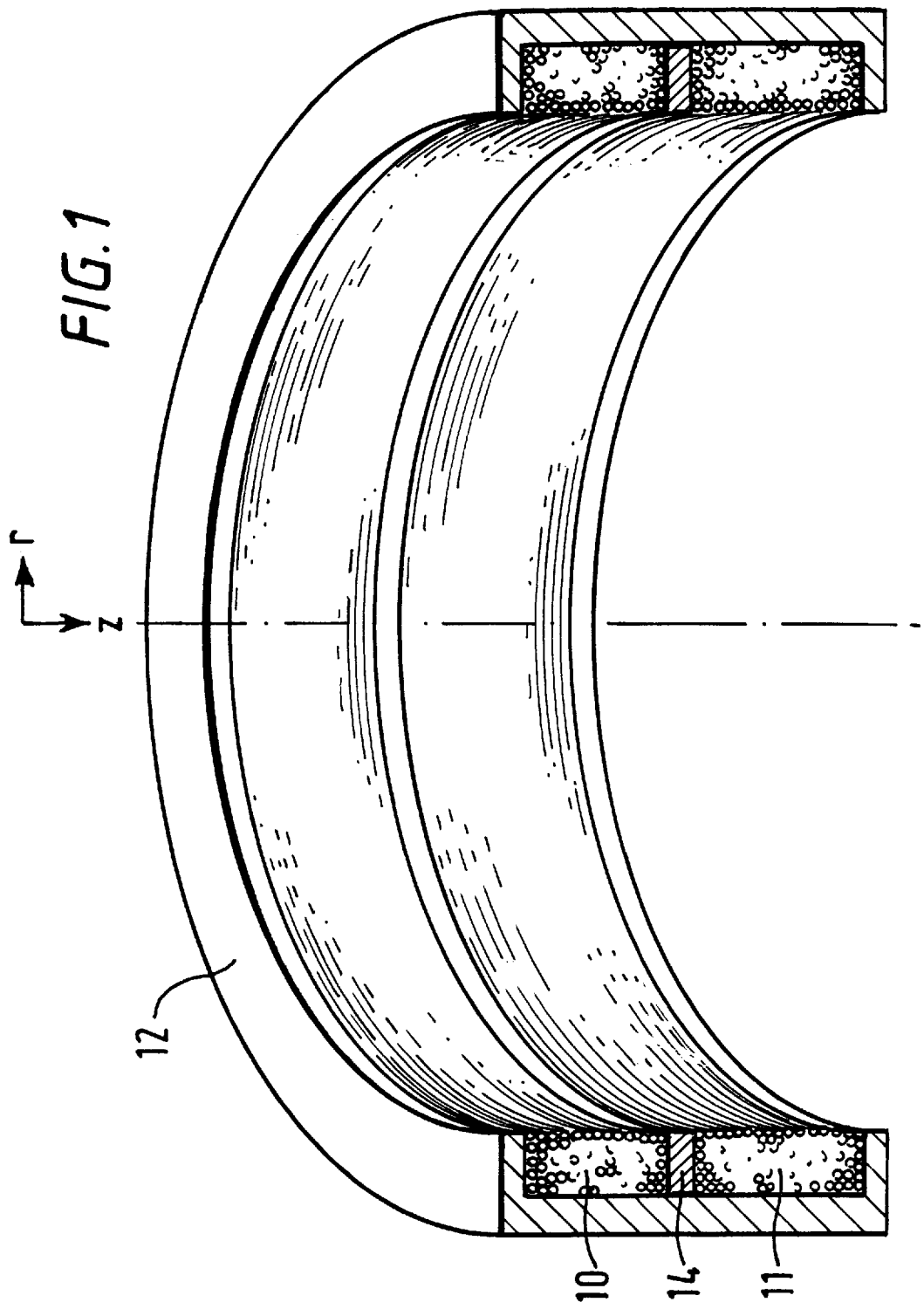
FIG. 1 is a perspective view in section of a magnetic field generating apparatus in accordance with the present invention.

The magnetic field generating apparatus shown comprises a first copper coil (10), which is spaced axially above a second copper coil (11). The two coils are supported within a steel shield (12). The annular space (14) between the coils (10) and (11) is filled with a material which can enhance the field strength of the magnetic field generated when current is passed through the coils (10) and (11). This material may be steel, or it may be steel with a layer of permanently magnetised material such as Neodymium-iron-boron. This material will be magnetised in the radial direction.

In use energising current is passed through the coils (10) and (11) in opposite directions so that the magnetic field generated by the coils has a zero axial component on the axis of the coil structure at a point substantially mid-way between the coils. It will be appreciated that in the case of crystal growth the coil structure shown in the Figure will surround a crucible which can be moved axially upwardly or downwardly within and relative to the coil structure. The crucible will be located so that the interface of the crystal being grown and the molten melt material is at the zero point of the magnetic field generated by the apparatus shown in the Figure.

The provision of the magnetic field enhancing material between the coils (10) and (11) significantly enhances the radial field strength of the magnetic field generating structure without any increase in the power supplied to the coils. The degree of this enhancement is illustrated in the accompanying table which shows the measured magnetic field at various positions. The fourth column shows the magnetic field where there is simply an air gap between the two coils, the fifth column shows the magnetic field where that gap is filled by steel and the sixth column shows the magnetic field when the gap is filled by steel with a layer of Neodymium-iron-boron.

TABLE

Magnetic field [gauss] in the bore of magnet [internal radius R]

| Position r | z | Magnetic field | No tooth | All steel tooth (14) | Steel + Neodym luna iron boron |
|---|---|---|---|---|---|
| 0 | 0 | $B_1$ | 0 | 0 | 0 |
|  |  | $B_2$ | 0 | 0 | 0 |
|  |  | Bmod | 0 | 0 | 0 |
| R/2 | 0 | $B_1$ | 473 | 581 | 621 |

TABLE-continued

Magnetic field [gauss] in the bore of magnet [internal radius R]

| Position r | z | Magnetic field | No tooth | All steel tooth (14) | Steel + Neodymluna iron boron |
|---|---|---|---|---|---|
|  |  | $B_2$ | 1 | 9 | 12 |
|  |  | Bmod | 473 | 581 | 622 |
| R/4 | R/4 | $B_1$ | 160 | 204 | 215 |
|  |  | $B_2$ | 370 | 490 | 519 |
|  |  | Bmod | 403 | 531 | 562 |
| 0 | R/2 | $B_1$ | 0 | 0 | 0 |
|  |  | $B_2$ | 544 | 691 | 725 |
|  |  | Bmod | 544 | 691 | 725 |

Figure 2:
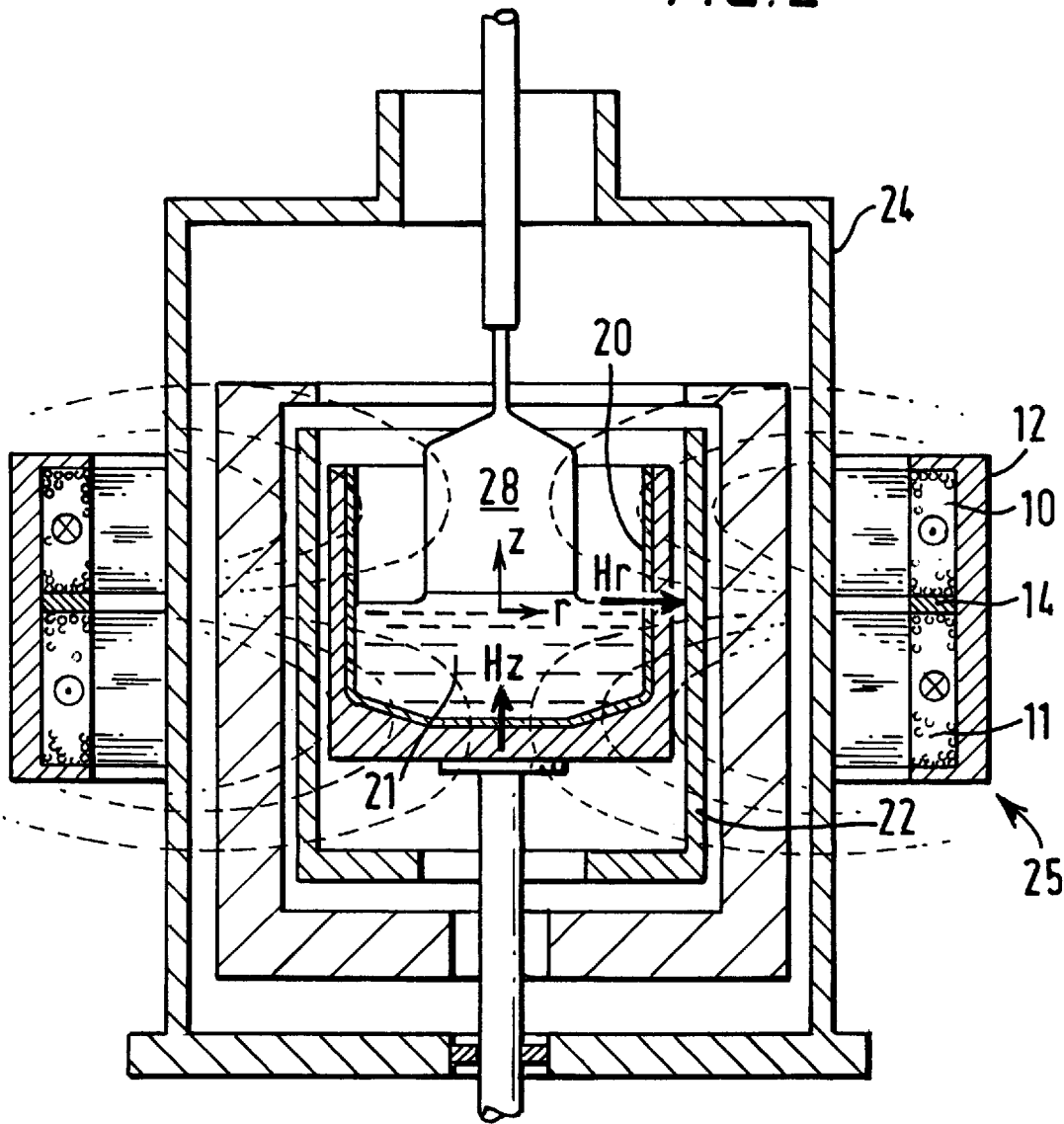
FIG. 2 is a schematic illustration of a crystal growth apparatus which use the magnetic field generating apparatus of FIG. 1.

FIG. 2 shows schematically one application of a magnetic field generator in accordance with the present invention. This Figure shows an apparatus known as a Czochralski crystal growth apparatus which is used for growing crystals, typically silicon crystals. The apparatus comprises a crucible (20), which contains molten material such as silicon 21 and which is mounted so that it can be rotated about a vertical axis and also so that it can be moved upwardly or downwardly. A heater (22) surrounds the crucible (20) and can be controlled to produce a predetermined temperature gradient in the crucible. These elements are disposed within a housing (24) around which is located a magnetic field generating device (25) of the type described with reference to FIG. 1.

In the use the crucible is rotated and a seed is brought into contact with the surface of the molten material (21) and then the seed is raised relative to the molten material to create a single crystal (28). During this procedure it is important that a precisely controlled temperature gradient is achieved in the growth region and this is provided by the heating element. The way in which crystals are grown in this way will be known by those skilled in the art and further details of this growth procedure are considered to be unnecessary here.

It is also important that a desired magnetic field profile prevails within the growth region and a magnetic field generating structure (25) of the type described with reference to FIG. 1 has been found particularly effective in achieving such a profile.

Figure 3:
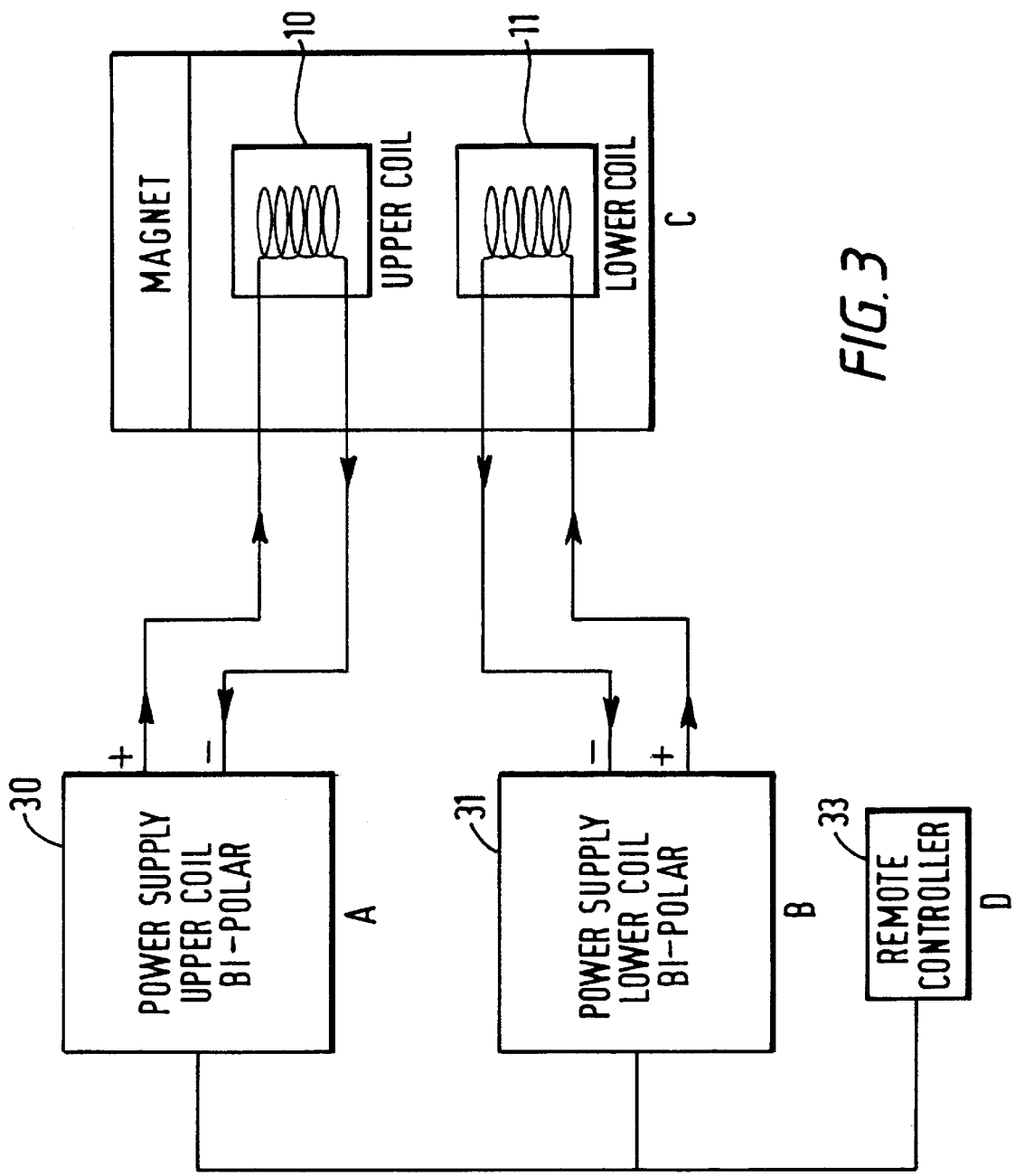
FIG. 3 is a block schematic diagram of apparatus for controlling the application of power to the coils of FIG. 1.

FIG. 3 illustrates schematically how the coils (10) and (11) are controlled to achieve the desired profile. The control includes a power supply (30) which can supply electrical current to the upper coil in either direction and a power supply (31) which can supply electrical current to the lower coil in either direction. A controller (33) is used to control the output current and voltage of the power supply (30, 31) so that the coils (10, 11) are energised to produce the desired magnetic field profile. The controller (33) may be computerised.

FIG. 3 shows a separate power supply for each coil. It may be possible to arrange the coils (10, 11) electrically in series in which case only one power supply is necessary. In this case the upper and lower coils are wound with opposite polarity.

As has been explained above, a particular advantage of the present invention is that for a given power input the present structure can achieve higher field strength and this has the advantage that it enables resistive type power generating devices to be used in situations where previously it may have been necessary to use superconducting arrangements. This leads to a lower initial cost, simpler construction and more reliable operation.

Figure 4:
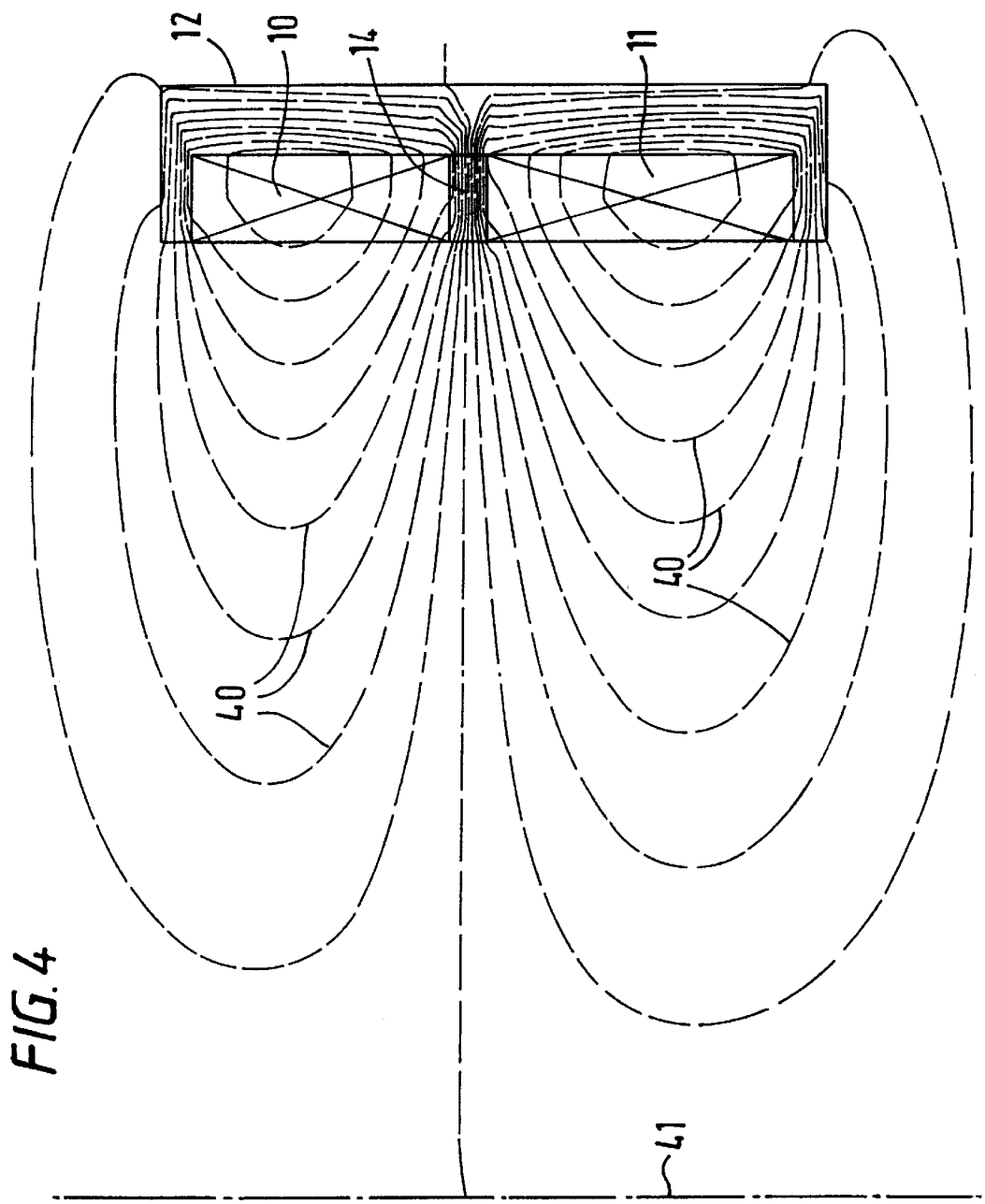
FIG. 4 is a view showing the magnetic field profile produced by the magnetic field generating apparatus of FIG. 2.

The magnetic field profile generated by the coils 11 and 12 of FIG. 2 is illustrated in FIG. 4. This shows the magnetic field lines 40 in one half of the apparatus and the magnetic field lines in the other half are a mirror image. The line 41 is the axis of symmetry of the apparatus. It can be seen that the coil arrangement produces a zero or near zero axial field at the interface of the crystal being grown and the melt material. Also it produces a high radial magnetic field at a radially outer portion of the apparatus in the region of the material 14 located between the coils. The field lines on FIG. 4 show the field enhancement produced by the use of the material 14.

What is claimed is:

1. Apparatus for generating a magnetic field, said apparatus comprising:

first and second axially spaced coils which are so arranged that when energized, they produce a magnetic field which has a zero axial field or substantially zero axial field at an axial position midway between the coils, wherein the annular space between the coils contains a material which enhances the radial field strength generated by the coils while maintaining said zero point.

2. Apparatus according to claim 1 wherein the material comprises steel.

3. Apparatus according to claim 1 wherein the other material comprises steel with a layer of material magnetized in the radial direction.

4. Apparatus according to claim 3 wherein the other material comprises Neodymium-iron-boron.

5. Crystal growth apparatus including magnetic field generating apparatus according to claim 1.

6. Crystal growth apparatus including magnetic field generating apparatus according to claim 2.

7. Crystal growth apparatus including magnetic field generating apparatus according to claim 3.

8. Crystal growth apparatus including magnetic field generating apparatus according to claim 4.

9. A method for generating a magnetic field, said method comprising:

axially spacing apart first and second coils which are so arranged that, when energized, they produce a magnetic field which has a zero axial field or substantially zero axial field at an axial position midway between the coils, and placing in the annular space between the coils a material which enhances the radial field strength generated by the coils while maintaining said zero point.

10. A method as in claim 9 wherein the material comprises steel.

11. A method as in claim 9 wherein the material comprises steel with a layer of material magnetized in the radial direction.

12. A method as in claim 11 wherein the other material comprises Neodymium-iron-boron.

13. A method for growing a crystal comprising generation of a magnetic field according to claim 9.

14. A method for growing a crystal comprising generating a magnetic field according to claim 10.

15. A method for growing a crystal comprising generating a magnetic field according to claim 11.

16. A method for growing a crystal comprising generating a magnetic field according to claim 12.

17. Apparatus for growing a semiconductor crystal, said apparatus comprising:

a temperature controlled crucible for containing molten semiconductor material from which a semiconductor crystal can be grown along a predefined axis from an interface with the molten material;

at least first and second coils of electrical conductors wound to circumferentially encircle said crucible with respective coincident first and second coil axes substantially aligned with said predefined axis, said coils being axially spaced apart, configured and energized with respective electrical currents to produce a substantially zero net magnetic field in the axial direction at said crystal growth interface; and a magnetic conductor disposed within at least part of an annular gap between said coils for enhancing the magnitude of magnetic fields in a radial direction with respect to the magnetic field that would otherwise be generated by said coils when air fills said annular gap, while maintaining said zero net magnetic field in the axial direction.

18. Apparatus as in claim 17 wherein said magnetic conductor comprises steel.

19. Apparatus as in claim 17 wherein said magnetic conductor comprises steel with a layer of other material magnetized in the radial direction.

20. Apparatus as in claim 19 wherein said other material comprises Neodymium-iron-boron.

* * * * *